(12) United States Patent
Hedler et al.

(10) Patent No.: US 8,106,511 B2
(45) Date of Patent: Jan. 31, 2012

(54) REDUCED-STRESS THROUGH-CHIP FEATURE AND METHOD OF MAKING THE SAME

(75) Inventors: Harry Hedler, Germering (DE); Roland Irsigler, Munich (DE); Rolf Weis, Dresden (DE); Detlef Weber, Ottendorf-Okrilla (DE)

(73) Assignee: Qimonda AG, München (DE)

( * ) Notice: Subject to any disclaimer, the term of this patent is extended or adjusted under 35 U.S.C. 154(b) by 567 days.

(21) Appl. No.: 12/039,232

(22) Filed: Feb. 28, 2008

(65) Prior Publication Data

US 2009/0218690 A1 Sep. 3, 2009

(51) Int. Cl.
*H01L 21/44* (2006.01)

(52) U.S. Cl. .................. 257/750; 257/773; 257/774

(58) Field of Classification Search .......... 257/750, 257/773, 774

See application file for complete search history.

(56) References Cited

U.S. PATENT DOCUMENTS

| | | | |
|---|---|---|---|
| 6,479,382 B1 * | 11/2002 | Naem | 438/658 |
| 6,534,814 B2 * | 3/2003 | Iba et al. | 257/304 |
| 7,199,050 B2 * | 4/2007 | Hiatt | 438/667 |
| 7,425,499 B2 * | 9/2008 | Oliver et al. | 438/597 |
| 2005/0260812 A1 * | 11/2005 | Kapteyn et al. | 438/243 |
| 2006/0148250 A1 | 7/2006 | Kirby | |
| 2007/0166991 A1 * | 7/2007 | Sinha | 438/597 |

* cited by examiner

*Primary Examiner* — Eugene Lee
(74) *Attorney, Agent, or Firm* — Cozen O'Connor

(57) ABSTRACT

A feature is inscribed in a major surface of a microelectronic workpiece having a material property expressed as a reference coefficient value. The feature includes a first material having a first coefficient value for the material property and a second material having a second coefficient value for the material property. The first coefficient value is different from the reference coefficient value different from the first coefficient value and the second coefficient value is different from the first coefficient value. The first and second materials behave as an aggregate having an aggregate coefficient value for the material property between the first coefficient value and the reference coefficient value.

24 Claims, 1 Drawing Sheet

REDUCED-STRESS THROUGH-CHIP FEATURE AND METHOD OF MAKING THE SAME

TECHNICAL FIELD

The present invention relates generally to electronic components and in particular embodiments to a reduced-stress through-chip feature and method of making the same.

BACKGROUND

Features inscribed into or provided through the surface of a semiconductor wafer or other microelectronic workpiece can serve a variety of functions. For example, a "via" or a "vertical interconnect access" is a through-chip feature that electrically couple terminals or other conductive elements on or proximate to one side of a wafer to conductive elements on or proximate to the other side of the wafer.

Typically, the formation of a via involves providing an opening in the microelectronic workpiece, i.e., in the wafer of semiconductor material. These openings can be manufactured in different ways, such as by using a dry-etch method or laser-drilling. Next, the wall or inner surface of the opening is electrically passivated by a layer of a dielectric, i.e., a non-conductive, material. This layer also serves as a seed layer enhancing adherence of other materials to the surface. Finally, the opening, which is now lined with the seed layer, is typically filled completely with a conductive material, such as a metal like copper, aluminum, tungsten or the like.

This approach, however, has certain drawbacks. First, the development of voids or cavities inside the conductive material caused by the shrinkage of the material during the solidification of the material cannot be completely prevented. Moreover, the mismatch of material properties such as the respective coefficients of thermal expansion (CTE) between the conductive material and the semiconductor substrate leads to different magnitudes of expansion as the microelectronic device or workpiece undergoes a temperature change. The mechanical stresses generated thereby may lead to cracks in and potentially a failure of the microelectronic device or workpiece.

Accordingly, a need exists for a through-chip feature that does not manifest these drawbacks. Furthermore a need exists for a method of forming such features.

SUMMARY OF THE INVENTION

An aspect of the present invention is the deposition of an aggregate of elements that are heterogeneous at least with respect to their expansion behavior. An aggregate, as used herein, shall mean a formation of a plurality of materials, heterogeneous at least as to one material property, such as CTE.

In an embodiment of the present invention, an inscribed feature is provided in a major surface of a microelectronic workpiece such as a semiconductor wafer, the feature having the above-described aggregate disposed therein.

In another embodiment of the present invention, a feature, such as an opening in a semiconductor wafer is formed of a first material having a first CTE deposited on the wafer, which subsequently is either covered by or filled with at least one additional layer of a material having a second CTE different from the first. The material of the additional layer or fill may be selected with a view to compensating, or counterbalancing, the thermal expansion or shrinkage of the first material. Moreover, the feature may thus be provided with at least one means for counteracting any CTE mismatch between the first material and the semiconductor wafer, in order to at least decrease (or, ideally, even neutralize) the stress-inducing effect of the difference in expansion behavior between the interconnect and the bulk semiconductor material.

BRIEF DESCRIPTION OF THE DRAWINGS

In the accompanying drawings.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The expansion behavior of an element, e.g., a hollow cylinder formed, for example, in a layer of material, is governed by the coefficient of thermal expansion (CTE) of its material and its thickness. The same applies for an element completely filling an opening, with the provision that the characteristic length defining the absolute value of expansion or shrinkage (i.e., negative expansion) is its diameter, not thickness. While the CTE defines the relative expansion (or shrinkage) of the material when subjected to a given temperature change, the thickness of such a layer (or diameter of such solid filling) makes it possible to determine the absolute value of such expansion (or shrinkage) for a certain element.

Figure 1:
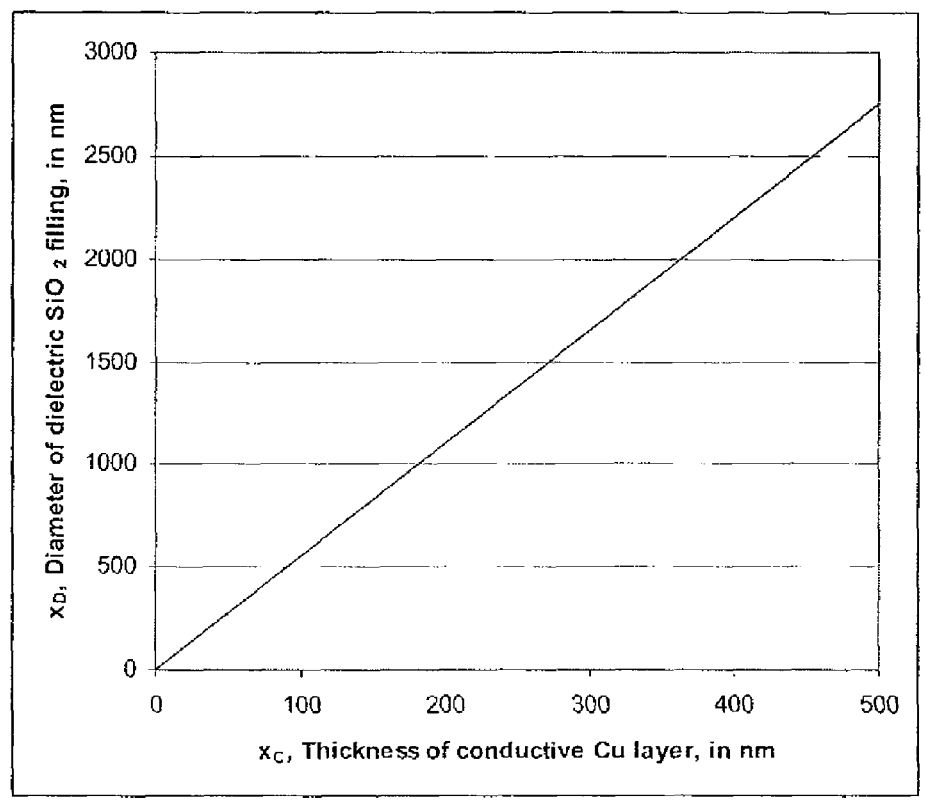
FIG. 1 shows the relationship between the thickness of an interconnect layer and the diameter of a dielectric compensation element disposed therein.

In an exemplary embodiment, a feature such as an interconnect is to be formed in a semiconductor substrate of silicon, having a CTE of about $3 \cdot 10^{-6}$ K$^{-1}$. Due to its high electrical conductivity, copper (having a CTE of about $16 \cdot 10^{-6}$ K$^{-1}$) is often chosen as the conductive material for forming the interconnect. If the opening in the semiconductor material was completely filled with copper, then the difference in the CTE of both materials would generate a strong in-plane stress in a microelectronic device having such interconnect. This stress can easily damage or destroy the device. It can be shown, however, that by forming an aggregate having a plurality of CTE values, an overall CTE of the interconnect and the additional layer or layers and/or fill can be reached which is significantly closer to the CTE of the semiconductor material than the CTE of known interconnects. This relationship is shown in FIG. 1.

For a given thickness $x_C$ and CTE $\alpha_C$ of a conductive layer constituting an interconnect in an opening of a semiconductor with a CTE $\alpha_{SC}$, the diameter $x_D$ of a dielectric fill with CTE $\alpha_D$ is calculated as:

$$x_D = \frac{\alpha_{SC} - \alpha_C}{\alpha_D - \alpha_{SC}} \cdot x_C$$

So, the $x_D$:$x_C$ ratio for a balanced expansion behavior of bulk semiconductor material versus the filling of the opening (i.e., the interconnect layer plus the dielectric filling) is calculated as:

$$\frac{x_D}{x_C} = \frac{\alpha_{SC} - \alpha_C}{\alpha_D - \alpha_{SC}}$$

In the above example, let the dielectric fill of the conductive layer constituting the interconnect be silicon oxide, having a CTE $\alpha_D$ of about $0.65 \cdot 10^{-6}$ K$^{-1}$. Then the diameter $x_D$ of the fill would have to be about five times the thickness $x_C$ of the conductive layer to reach an overall expansion behavior of the conductive layer and dielectric fill that matches the expansion behavior of the semiconductor material. As an example, a copper layer of about 200 nm in thickness would require a silicon oxide filling of about 1106 nm in diameter to reach full compensation. However, even if the actual $x_D$:$x_C$ ratio is not exactly the same as calculated above, a significant decrease of in-plane stress can still be achieved.

Figure 2:
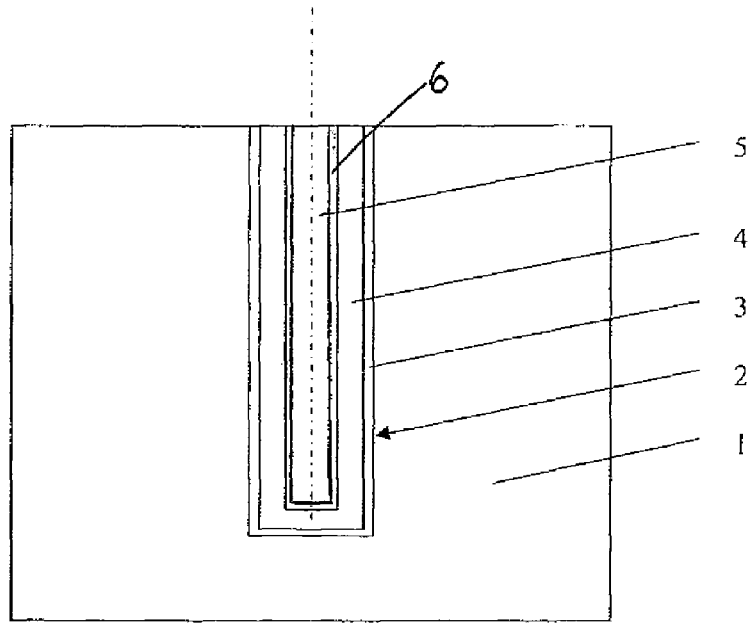
FIG. 2 shows an example of an interconnect formed of an aggregate.

Referring now to FIG. 2, an exemplary embodiment of an interconnect is shown.

In a semiconductor substrate 1, for instance a silicon wafer comprising a multitude of integrated circuit chips, a blind hole 2 is manufactured, for instance in a dry etch process. A seed layer 3, e.g., a dielectric seed layer, is deposited on the inner walls of the blind hole 2. The seed layer 3 is then covered with a layer of a conductive material 4. Finally, the inner surface of the conductive layer 4 is filled with a non-conductive material 5.

When the CTE and the relative thicknesses of both the conductive layer 4 and the non-conductive layer 5 are selected so as to approach that of the substrate material, the aggregate of elements filling the blind hole 2 behaves approximately like the semiconductor material of the substrate 1. Thermal stress in the substrate 1 caused by the CTE mismatch between the semiconductor material of the substrate 1 and the through-wafer interconnect is therefore considerably lower than with a conventional via under the same thermal conditions.

The non-conductive layer 5 can be an oxide, nitride or carbide of silicon, an oxide, nitride or carbide of titanium, an oxide, nitride or carbide of ruthenium, or an oxide, nitride or carbide of aluminum, as examples. In one particular example, the non-conductive layer 5 comprises SiO$_2$ precipitated from gaseous SiO$_4$C$_8$H$_2$O (Tetraethylorthosilicate, TEO).

In another embodiment, a third material 6 can be deposited in the opening 2. In various embodiments, the third material can be an oxide, nitride or carbide of silicon, an oxide, nitride or carbide of titanium, an oxide, nitride or carbide of ruthenium, or an oxide, nitride or carbide of aluminum.

In a subsequent step, the substrate 1 may be thinned by removing semiconductor material from its underside. If enough material is removed, for instance in a grinding process, then the lower end of the aggregate of elements 3, 4, 5 filling the blind hole 2 is exposed such that the conductive layer 4 forms an electrically conductive through-wafer interconnect.

Furthermore, the workpiece, for instance the wafer carrying integrated circuits, may be diced, thus singulating the individual chips, which may then be used in a semiconductor device, for instance in a so-called package.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microelectronic device comprising:
a semiconductor substrate having a reference coefficient value of thermal expansion;
a first material arranged in a through-via hole of the semiconductor substrate, the first material comprising a first material thickness and having a first coefficient value of thermal expansion, the first coefficient value being different from the reference coefficient value; and
a second material arranged in the through-via hole of the semiconductor substrate, the second material comprising a second material thickness and having a second coefficient value of thermal expansion, the second coefficient value being different from the first coefficient value;
wherein the first material thickness and the second material thickness have an aggregate coefficient value, wherein the aggregate coefficient value is closer to the reference coefficient value than the first coefficient value is to the reference coefficient value; and
wherein second material thickness is selected according to a function of the first coefficient value and the second coefficient value relative to the reference coefficient value and the first material thickness.

2. The microelectronic device of claim 1, wherein the reference coefficient value is substantially the same as the aggregate coefficient value.

3. The microelectronic device of claim 1, wherein the first material and the second material in the through-via hole form an electrically conductive interconnect.

4. The microelectronic device of claim 3, wherein the first material is a conductive material.

5. The microelectronic device of claim 4, wherein the second material comprises a dielectric.

6. The microelectronic device of claim 1, further comprising a third material in the through-via hole of the semiconductor substrate.

7. The microelectronic device of claim 1, further comprising a seed layer between the first material and the semiconductor substrate in the through-via hole of the semiconductor substrate.

8. A semiconductor device comprising:
a semiconductor substrate having a reference coefficient value of thermal expansion (CTE) $\alpha_{SC}$;
active circuitry disposed at an upper surface of the semiconductor substrate;
a through-via hole extending from the upper surface to a lower surface of the semiconductor substrate;
an electrically conductive layer lining the through-via hole, wherein the electrically conductive layer has a first CTE $\alpha_C$, and wherein the electrically conductive layer has a first thickness; and
an electrically insulating layer filling the through-via hole such that the electrically conductive layer is disposed between the insulating layer and the semiconductor substrate, wherein the electrically insulating layer has a second CTE $\alpha_D$, and wherein the electrically insulating layer has a second thickness; and
wherein the first thickness of the electrically conductive layer is $x_C$ and the second thickness of the electrically insulating layer is $x_D$, wherein $x_D$:$x_C$ is set so that $$\frac{x_D}{x_C} \cong \frac{\alpha_{SC} - \alpha_C}{\alpha_D - \alpha_{SC}}.$$

9. The device of claim 8, wherein the electrically conductive layer comprises copper.

10. The device of claim 9, wherein the electrically insulating layer comprises silicon oxide.

11. A semiconductor device, comprising:
a semiconductor substrate;
a through-via hole extending from an upper surface to a lower surface of the semiconductor substrate;
a seed layer lining an inner surface of the through-via hole;
an electrically conductive material layer lining the seed layer;
a first electrically insulating material lining the electrically conductive material layer; and
a second electrically insulating material layer filling the through-via hole;
where the semiconductor substrate has a reference coefficient value of thermal expansion (CTE), wherein the electrically conductive material of the electrically conductive material layer has a conductive CTE, wherein the first electrically insulating material of the first electrically insulating material layer has a first insulating CTE, wherein the second electrically insulating material of the second electrically insulating material layer has a second insulating CTE, and wherein an aggregate coefficient value of the conductive CTE, the first insulating CTE and the second insulating CTE is substantially the same as the reference CTE.

12. The semiconductor device of claim 11, wherein the seed layer comprises a dielectric seed layer.

13. The semiconductor device of claim 11, wherein the first electrically insulating material layer comprises an oxide, nitride or carbide of silicon.

14. The semiconductor device of claim 13, wherein the silicon oxide is formed from gaseous $SiO_4C_8H_{20}$ (Tetraethylorthosilicate, TEO).

15. The semiconductor device of claim 11, wherein the first electrically insulating material layer comprises an oxide, nitride or carbide of titanium.

16. The semiconductor device of claim 11, wherein the first electrically insulating material layer comprises an oxide, nitride or carbide of ruthenium.

17. The semiconductor device of claim 11, wherein the first electrically insulating material layer comprises an oxide, nitride or carbide of aluminum.

18. The semiconductor device of claim 11, wherein the second electrically insulating material layer comprising an oxide, nitride or carbide of silicon.

19. The semiconductor device of claim 11, wherein the second electrically insulating material layer comprising an oxide, nitride or carbide of titanium.

20. The semiconductor device of claim 11, wherein the second electrically insulating material layer comprising an oxide, nitride or carbide of ruthenium.

21. The semiconductor device of claim 11, wherein the second electrically insulating material layer comprising an oxide, nitride or carbide of aluminum.

22. The semiconductor device of claim 11, wherein the electrically conductive material layer comprises copper.

23. The semiconductor device of claim 8, wherein the electrically conductive layer and the electrically insulating layer in the through-via hole form an electrically conductive interconnect.

24. The semiconductor device of claim 1, wherein the first material thickness is $x_C$, wherein the second material thickness is $x_D$, wherein the first coefficient is $\alpha_C$, wherein the second coefficient is $\alpha_D$, wherein the reference coefficient value is $\alpha_{SC}$, and wherein the function is $$\frac{x_D}{x_C} \cong \frac{\alpha_{SC} - \alpha_C}{\alpha_D - \alpha_{SC}}.$$

* * * * *